United States Patent
Yamada (10) Patent No.: US 8,471,309 B2
(45) Date of Patent: Jun. 25, 2013

(54) COMPOUND SEMICONDUCTOR DEVICE AND METHOD OF MANUFACTURING THE SAME

(75) Inventor: Atsushi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 242 days.

(21) Appl. No.: 13/096,187

(22) Filed: Apr. 28, 2011

(65) Prior Publication Data

US 2012/0049180 A1    Mar. 1, 2012

(30) Foreign Application Priority Data

Aug. 31, 2010    (JP) .................... 2010-194820

(51) Int. Cl.
*H01L 29/76*    (2006.01)
(52) U.S. Cl.
USPC ............ 257/288; 257/E29.246; 257/E21.403; 257/E29.089; 257/E29.09; 257/E29.255; 438/285

(58) Field of Classification Search
None
See application file for complete search history.

(56) References Cited

U.S. PATENT DOCUMENTS

2009/0121775 A1    5/2009    Ueda

FOREIGN PATENT DOCUMENTS

| JP | 2004-335960 A1 | 11/2004 |
| JP | 2007-19309 A1 | 1/2007 |
| JP | 2009-76845 A1 | 4/2009 |

*Primary Examiner* — Fei Fei Yeung Lopez
(74) *Attorney, Agent, or Firm* — Kratz, Quintos & Hanson, LLP (57) ABSTRACT

A compound semiconductor device includes a substrate; a compound semiconductor layer formed over the substrate; and a gate electrode formed over the compound semiconductor layer with a gate insulating film arranged therebetween. The gate insulating film includes a first layer having reverse spontaneous polarization, the direction of which is opposite to spontaneous polarization of the compound semiconductor layer.

18 Claims, 11 Drawing Sheets

COMPOUND SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2010-194820, filed on Aug. 31, 2010, the entire contents of which are incorporated herein by reference.

FIELD

The present invention generally relates to a compound semiconductor device and a method of manufacturing the same.

BACKGROUND

A nitride semiconductor device has been actively developed as a semiconductor device having a high withstand voltage and a high output power by using its features (such as, a high saturation electron velocity and a wide band gap). As the nitride semiconductor device, many field effect transistors, in particular, high electron mobility transistors (HEMTs), have been reported. In particular, an AlGaN/GaN HEMT using GaN as an electron transit layer and AlGaN as an electron supply layer has drawn attention. In the AlGaN/GaN HEMT, distortion resulting from the difference in lattice constant between GaN and AlGaN is generated in AlGaN. Accordingly, by piezo polarization generated by the above distortion and spontaneous polarization of AlGaN, a two-dimensional electron gas (2DEG) at a high concentration is obtained. Accordingly, a high withstand voltage and a high output power are realizable.

As documents of related techniques, for example, there are Japanese Unexamined Patent Application Publication Nos. 2007-19309, 2009-76845 and 2004-335960.

SUMMARY

According to an aspect of the invention, a compound semiconductor device includes a substrate; a compound semiconductor layer formed over the substrate; and a gate electrode formed over the compound semiconductor layer with a gate insulating film arranged therebetween, the gate insulating film including a first layer having reverse spontaneous polarization, the direction of which is opposite to spontaneous polarization of the compound semiconductor layer.

According to another aspect of the invention, a method of manufacturing a compound semiconductor device includes forming a compound semiconductor layer over a substrate; forming a gate insulating film over the compound semiconductor layer; and forming a gate electrode over the gate insulating film, the gate insulating film including a first layer having reverse spontaneous polarization, the direction of which is opposite to spontaneous polarization of the compound semiconductor layer.

According to another aspect of the invention, an electrical power circuit includes a high-voltage circuit; a low-voltage circuit; and a transformer provided therebetween, the high-voltage circuit including a transistor which includes a substrate; a compound semiconductor layer formed over the substrate; and a gate electrode formed over the compound semiconductor layer with a gate insulating film arranged therebetween, the gate insulating film including a first layer having reverse spontaneous polarization, the direction of which is opposite to spontaneous polarization of the compound semiconductor layer.

According to another aspect of the invention, a high frequency amplifier includes a substrate; a compound semiconductor layer formed over the substrate; and a gate electrode formed over the compound semiconductor layer with a gate insulating film arranged therebetween, the gate insulating film including a first layer having reverse spontaneous polarization, the direction of which is opposite to spontaneous polarization of the compound semiconductor layer.

The object and advantages of the invention will be realized and attained by at least those elements, features, and combinations particularly pointed out in the claims.

It is to be understood that both the foregoing general description and the following detailed description are exemplary and explanatory and are not restrictive of the invention, as claimed.

DESCRIPTION OF EMBODIMENTS

For example, as a switching element used for an electrical power apparatus or the like, a so-called normally-OFF operation in which substantially no electric current flows when the voltage is off is preferable. However, in an AlGaN/GaN HEMT, since the concentration of a two-dimensional electron gas is high, the quantity of electrons in a channel region is also large; and hence, in some cases, it may be difficult to realize a normally-off operation.

Normally-off techniques proposed for an AlGaN/GaN HEMT have not been able to realize a sufficient normally-off operation. In addition, for example, an increase in sheet resistance, an increase in gate leak current, and a decrease in output power, which result from a damage done to an electron transit region by heat treatment or the like in a manufacturing process, cannot be avoided.

Hereinafter, embodiments will be described in detail in reference to the drawings. In the following embodiments, the structure of a compound semiconductor device will be described together with a manufacturing method thereof. In the following drawings, for convenience of illustration, some constituent members are not shown by relatively accurate size and thickness in some cases. In the embodiments, element isolation is performed by a predetermined element isolation method, such as a shallow trench isolation (STI) method or ion implantation performed in an element isolation region.

In a first embodiment, as the compound semiconductor device, an AlGaN/GaN HEMT will be described.

FIGS. 1A to 1K are views illustrating a method for manufacturing a compound semiconductor device according to the first embodiment.

Figure 1A:
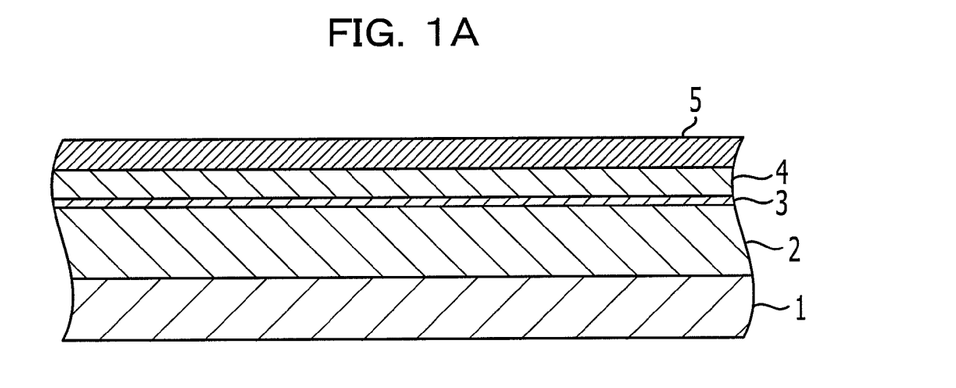
FIGS. 1A to 1K are views illustrating a method of manufacturing a compound semiconductor device according to a first embodiment.

As illustrated in FIG. 1A, an electron transit layer 2, an interlayer 3, an electron supply layer 4, and a cap layer 5 are formed, for example, over a semi-insulating SiC substrate 1 used as a growth substrate. In the AlGaN/GaN HEMT, a two-dimensional electron gas (2DEG) is generated in the vicinity of the interface of the electron transit layer 2 with the electron supply layer 4 (directly in the interlayer 3).

On the SiC substrate 1, the following compound semiconductor layers are grown, for example, by a molecular beam epitaxy (MBE) method. Instead of an MBE method, for example, a metal organic chemical vapor deposition (MOCVD) method may be used.

Over the SiC substrate 1, i-GaN, i-AlGaN, n-AlGaN, and n$^+$-GaN are deposited, so that the electron transit layer 2, the interlayer 3, the electron supply layer 4, and the cap layer 5 are formed, respectively. In this case, for example, the electron transit layer 2 is formed to have a thickness of approximately 2 μm; the interlayer 3 is formed to have a thickness of approximately 5 nm, for example, at an Al ratio of 0.2; the electron supply layer 4 is formed to have a thickness of approximately 30 nm, for example, at an Al ratio of 0.2; and the cap layer 5 is formed to have a thickness of approximately 10 nm. In addition, the electron supply layer 4 may be formed as an intentionally undoped AlGaN (i-AlGaN) layer.

As growth conditions of i-GaN, i-AlGaN, n-GaN, and n-AlGaN, a mixed gas containing, for example, at least two of a trimethylaluminum gas, a trimethylgallium gas, and an ammonia gas is used as a raw material gas. In accordance with a compound semiconductor layer to be grown, the supply and the flow rate of each of a trimethylaluminum gas which is an Al source and a trimethylgallium gas which is a Ga source are appropriately set. The flow rate of an ammonia gas which is a common raw material is set, for example, to approximately 100 ccm to 10 LM. In addition, the growth pressure is set, for example, to approximately 50 to 300 Torr, and the growth temperature is set, for example, to approximately 1,000° C. to 1,200° C. When n-GaN and n-AlGaN are grown, for example, a gas, such as SiH$_4$, containing Si is added as an n-type impurity at a predetermined flow rate to a raw material gas, so that Si is doped to GaN and AlGaN. The doping concentration of Si is set in, for example, a range of approximately $1 \times 10^{18}$ to $1 \times 10^{20}/cm^3$ and is set to, for example, approximately $5 \times 10^{18}/cm^3$.

The electron transit layer 2, the interlayer 3, the electron supply layer 4, and the cap layer 5 (i-GaN, i-AlGaN, n-AlGaN, and n$^+$-GaN, respectively) are each formed to have a Ga polarity. That is, in each of these layers, the surface thereof opposite to the SiC substrate 1 is terminated by Ga, and the electric field of spontaneous polarization is generated in the direction from a lower portion to an upper portion in the case in which the position of the SiC substrate 1 is regarded as a lowermost portion.

Figure 1B:
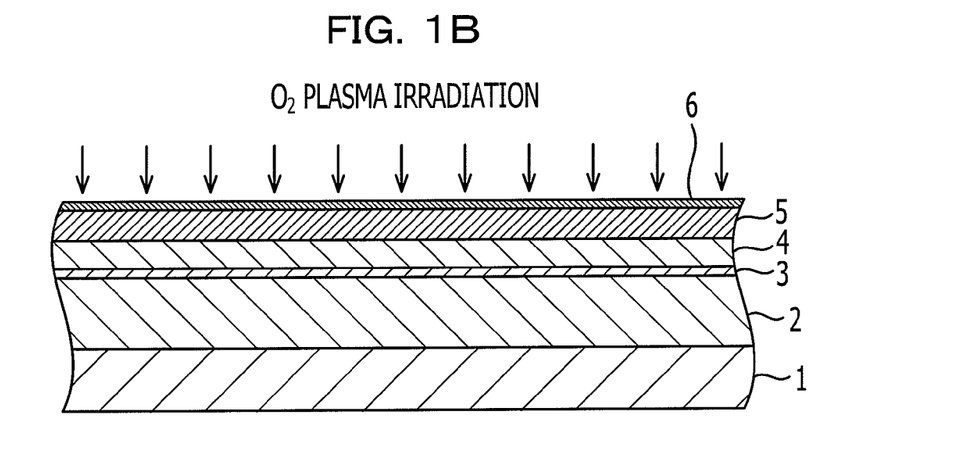

As illustrated in FIG. 1B, a polarity reverse layer 6 is formed in a surface layer of the cap layer 5.

The surface of the cap layer 5 is irradiated, for example, with oxygen (O) plasma. Accordingly, the surface layer (GaN) of the cap layer 5 is denatured, and a polarity reverse layer 6 containing Ga$_2$O$_3$ is formed to have a thickness of, for example, approximately 1 nm. The polarity reverse layer 6 is able to reverse the polarity of a semiconductor layer or the like to be formed thereon.

Instead of irradiation of the surface of the cap layer 5 with oxygen plasma, the polarity reverse layer 6 may be formed by depositing one of Ga$_2$O$_3$, Al$_2$O$_3$, In$_2$O$_3$, Cr$_2$O$_3$, and a mixed crystal containing at least two thereof by a sputtering method or the like.

Figure 1C:
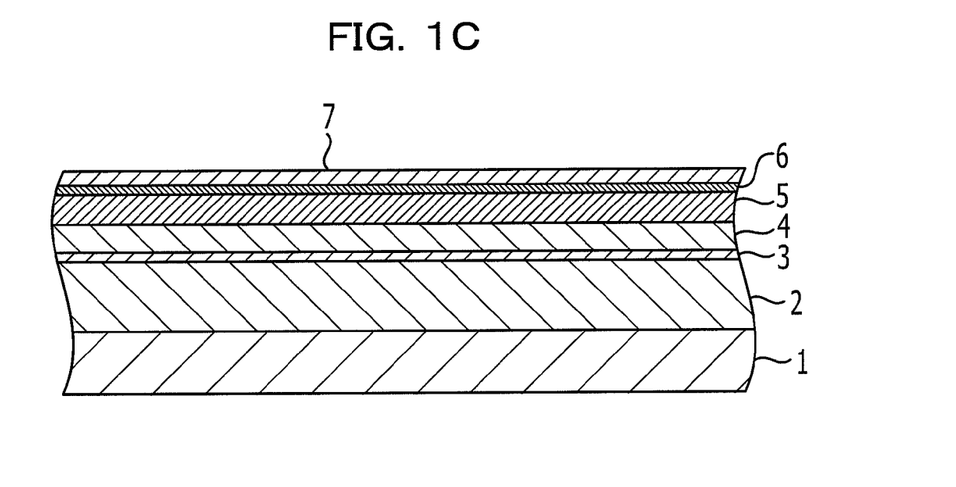

As illustrated in FIG. 1C, a reverse polarity layer 7 is formed over the polarity reverse layer 6.

For example, ZnO having a thickness of approximately 10 nm is formed by supplying Zn using an MBE method or the like. In this case, ZnO has an O polarity by the presence of the polarity reverse layer 6; and hence, the reverse polarity layer 7 is formed. In the reverse polarity layer 7, the surface thereof opposite to the SiC substrate 1 is terminated by O, and in the direction from an upper portion to a lower portion in the case in which the position of the SiC substrate 1 is regarded as a lowermost portion; that is, for example, in the direction opposite to the spontaneous polarization of the cap layer 5, the electric field of spontaneous polarization is generated.

Instead of the O-polarity ZnO, the reverse polarity layer 7 may be formed by growing O-polarity MgO or a mixed crystal containing O-polarity ZnO and O-polarity MgO.

Figure 1D:
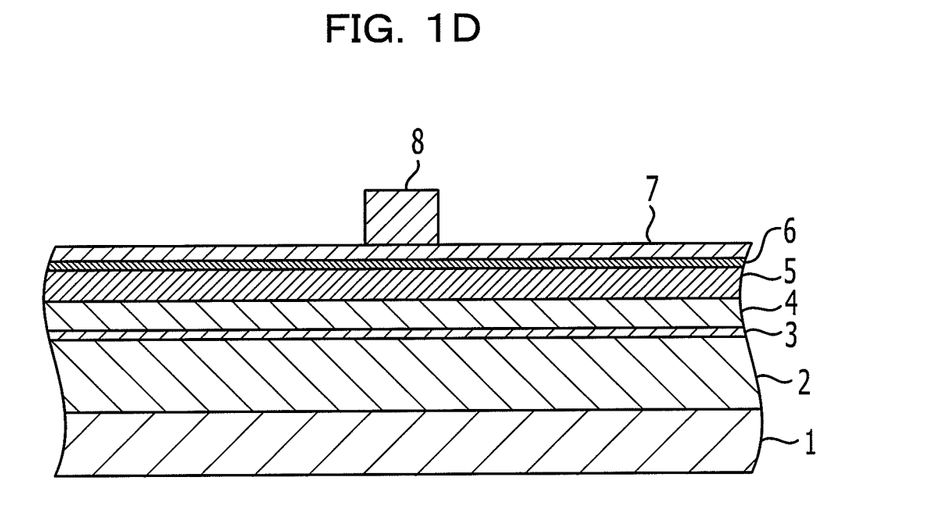

As illustrated in FIG. 1D, a resist mask 8 for forming a gate insulating film is formed.

A resist is applied over the reverse polarity layer 7 and is then processed by a lithography method. Accordingly, the resist mask 8 is formed at a gate insulating film forming portion over the reverse polarity layer 7.

Figure 1E:
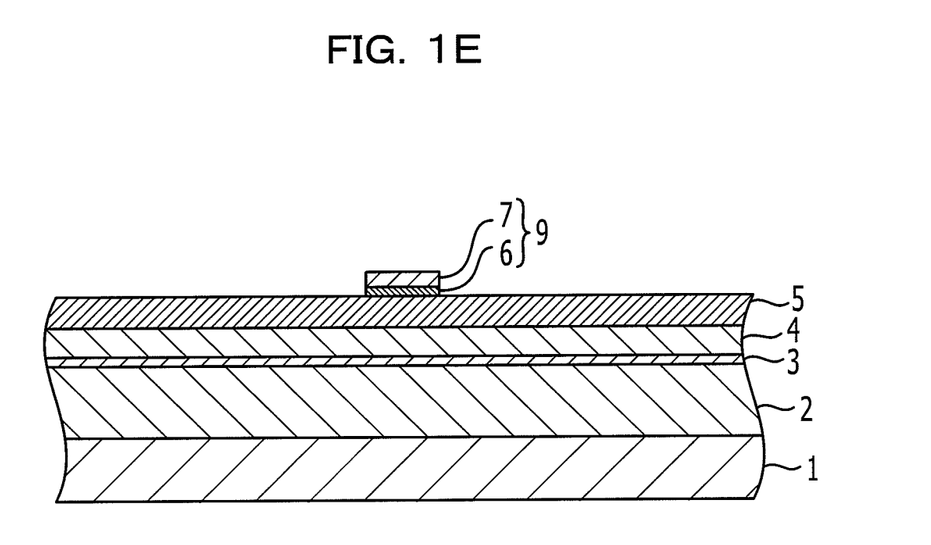

As illustrated in FIG. 1E, a gate insulating film 9 is formed.

The reverse polarity layer 7 and the polarity reverse layer 6 are dry-etched using the resist mask 8. Accordingly, the gate insulating film 9 having a lamination structure of the polarity reverse layer 6 and the reverse polarity layer 7 is formed at a gate insulating film forming portion over the cap layer 5.

The resist mask 8 is removed by an ashing treatment or the like.

Figure 1F:
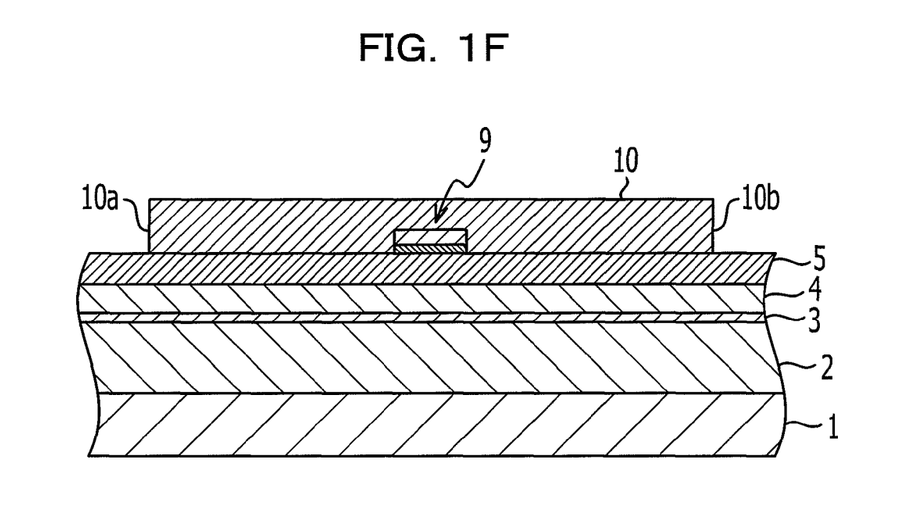

As illustrated in FIG. 1F, a resist mask 10 for forming a source electrode and a drain electrode is formed.

A resist is applied over the cap layer 5 so as to cover the gate insulating film 9 and is then processed by a lithography method. Accordingly, a resist mask 10 having openings 10a and 10b is formed. The opening 10a is formed so as to expose a source electrode forming portion over the surface of the cap layer 5. The opening 10b is formed so as to expose a drain electrode forming portion over the surface of the cap layer 5.

Figure 1G:
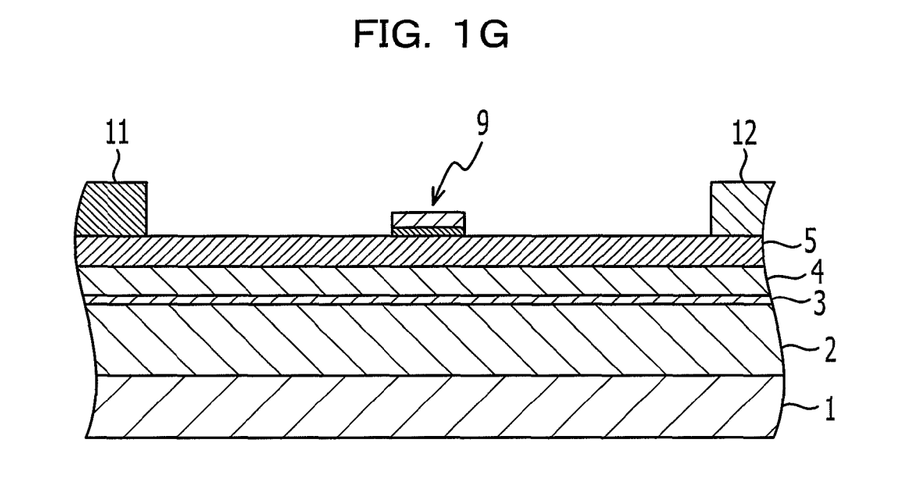

As illustrated in FIG. 1G, a source electrode 11 and a drain electrode 12 are formed.

For example, Ti/Al used as an electrode material is deposited over the resist mask 10 by a deposition method or the like so as to fill the openings 10a and 10b. By a lift-off method, the resist mask 10 and Ti/Al deposited thereover are removed. Subsequently, the SiC substrate 1 is heat-treated in, for example, a nitrogen atmosphere at approximately 600° C., so that the ohmic contact is formed. By the steps described above, the source electrode 11 and the drain electrode 12 are formed over the cap layer 5.

Figure 1H:
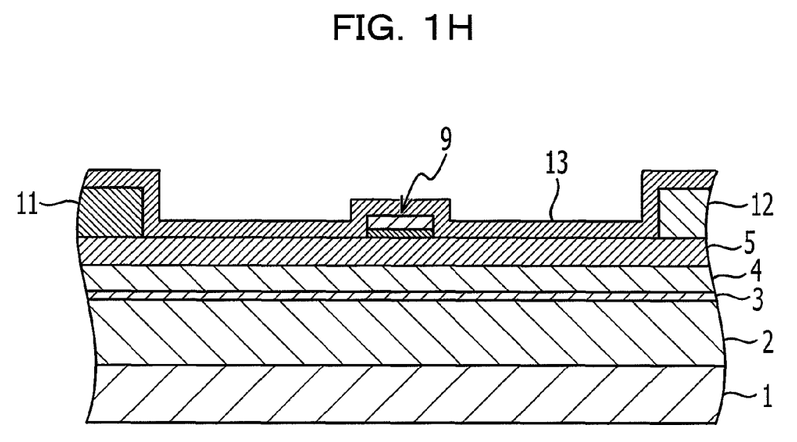

As illustrated in FIG. 1H, a passivation film 13 is formed.

For example, by a plasma enhanced chemical vapor deposition (PECVD) method, an insulating film, which is a SiN film in this case, is deposited to have a thickness of approximately 200 nm so as to cover the SiC substrate 1. Accordingly, the passivation film 13 is formed.

Figure 1I:
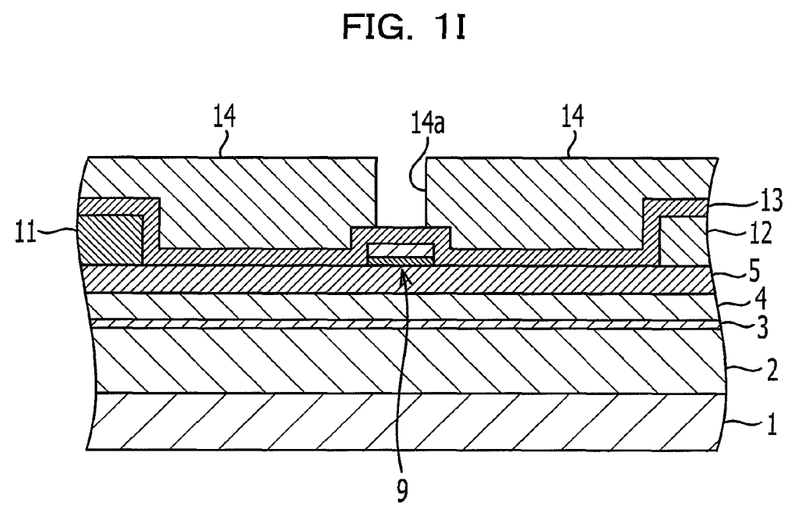

As illustrated in FIG. 1I, a resist mask 14 is formed.

A resist is applied over the passivation film 13 and is then processed by a lithography method. Accordingly, a resist mask 14 having an opening 14a is formed at a gate electrode forming portion.

Figure 1J:
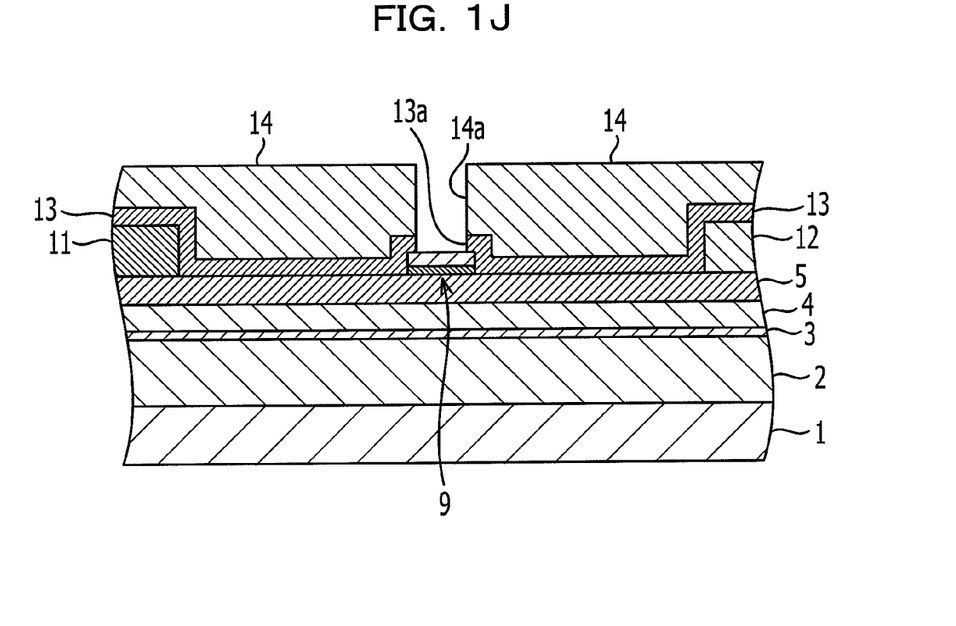

As illustrated in FIG. 1J, an opening 13a is formed in the passivation film 13.

The passivation film 13 is processed by dry etching using the resist mask 14 as a mask, and a part of the passivation film 13 exposed through the opening 14a is removed. Accordingly, the opening 13a which partly exposes the surface of the gate insulating film 9 (reverse polarity layer 7) is formed in the passivation film 13.

Figure 1K:
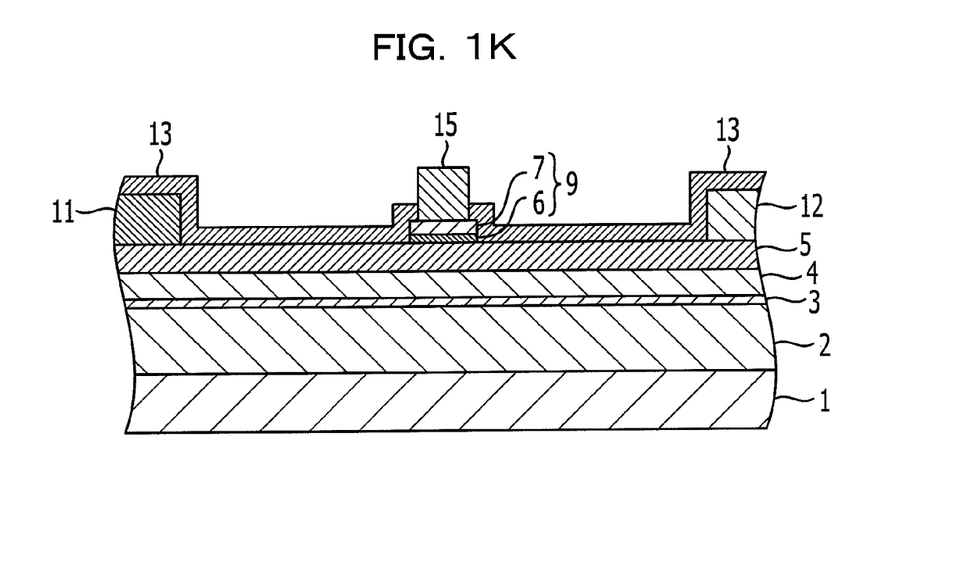

As illustrated in FIG. 1K, a gate electrode 15 is formed.

For example, Ni/Au used as an electrode material is deposited over the resist mask 14 by a deposition method or the like so as to fill the whole opening 13a and a part of the opening 14a. By a lift-off method, the resist mask 14 and Ni/Au deposited thereover are removed. Through the steps described above, by filling Ni/Au in the opening 13a, the gate electrode 15 is formed over the cap layer 5 with the gate insulating film 9 interposed therebetween so as to protrude upward from the surface of the passivation film 13.

Subsequently, the AlGaN/GaN HEMT is formed through various steps, such as formation of an interlayer insulation film covering the gate electrode 15 and formation of wires connected to the source electrode 11, the drain electrode 12, and the gate electrode 15.

The function and effect of the AlGaN/GaN HEMT of this embodiment will be described in comparison with those of a comparative example.

Figure 2:
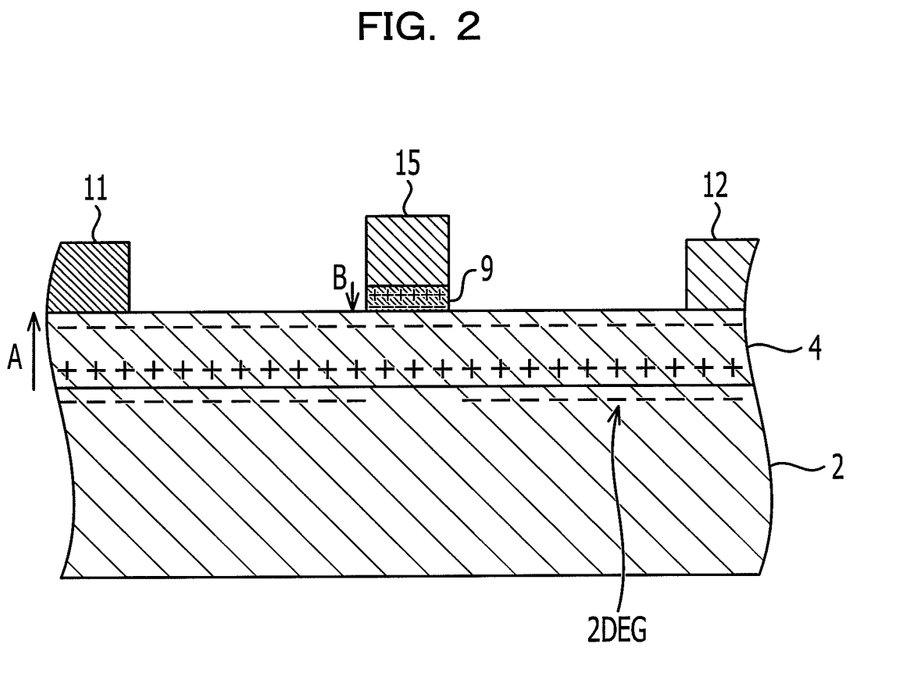
FIG. 2 is a view illustrating the function and effect of an AlGaN/GaN HEMT according to the first embodiment.
Figure 3:
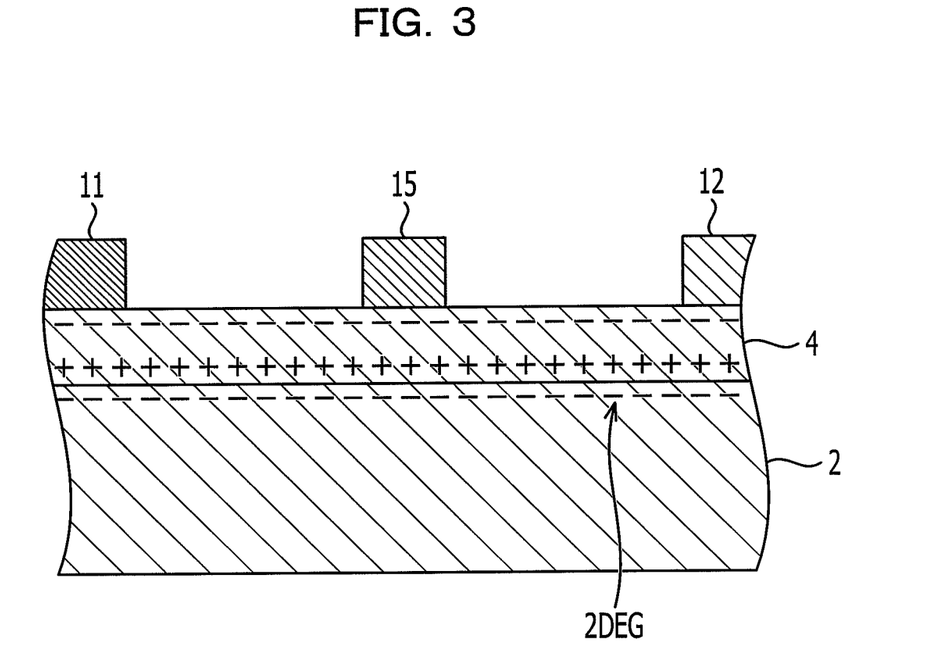
FIG. 3 is a view of an AlGaN/GaN HEMT according to a comparative example.
Figure 4A:
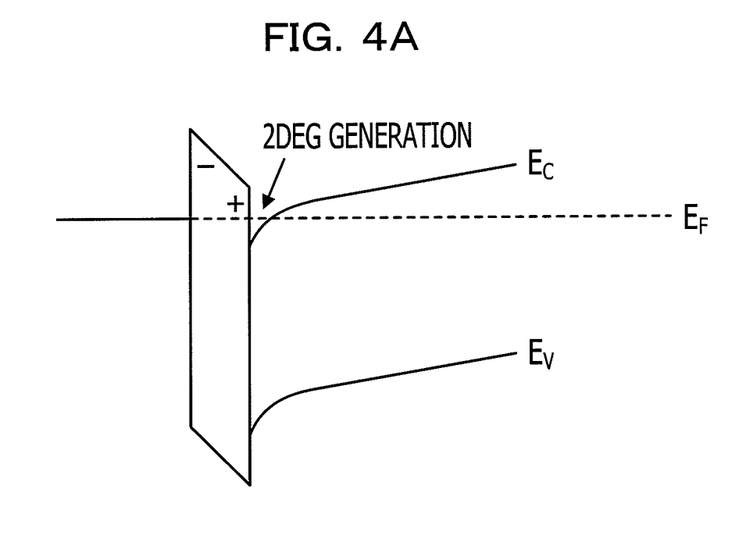
FIG. 4A is view of a band diagram of the AlGaN/GaN HEMT according to the comparative example.

FIG. 2 is a view illustrating the function and effect of the AlGaN/GaN HEMT of this embodiment and is a view corresponding to that illustrated in FIG. 1K. FIG. 3 is a view illustrating an AlGaN/GaN HEMT of the comparative example. FIG. 4A is a view illustrating a band diagram of the AlGaN/GaN HEMT of the comparative example; and FIG. 4B is a view illustrating a band diagram of the AlGaN/GaN HEMT of this embodiment.

In the AlGaN/GaN HEMT illustrated in FIG. 3, distortion resulting from the difference in lattice constant between the electron transit layer 2 of GaN and the electron supply layer 4 of AlGaN is generated in the electron supply layer 4, and piezo polarization is generated. In this case, as illustrated in FIG. 4A, at the interface of the electron transit layer 2 with the electron supply layer 4, Fermi energy $E_F$ becomes larger than conduction band $E_C$, and a two-dimensional electron gas (2DEG) at a high concentration is obtained. Accordingly, a high output is realized. However, because of this two-dimensional electron gas at a high concentration, the threshold of the gate voltage turns into a negative value, and a large amount of two-dimensional electron gas is present in the channel region even in an OFF state. Hence, it may be difficult to realize a normally-off operation in some cases.

In the AlGaN/GaN HEMT according to this embodiment, as illustrated in FIG. 2, the gate insulating film 9 is provided between the electron supply layer 4 (the cap layer 5 in FIG. 1K) and the gate electrode 15. An n-AlGaN of the electron supply layer 4 has a Ga polarity, and the electric field of spontaneous polarization is generated from the lower portion toward the upper portion as illustrated by an arrow A. On the other hand, in the gate insulating film 9, ZnO of the reverse polarity layer 7 has an O polarity, and the electric field of spontaneous polarization is generated in the direction opposite to that illustrated by the arrow A; that is, in the direction from the upper portion toward the lower portion as illustrated by an arrow B.

Figure 4B:
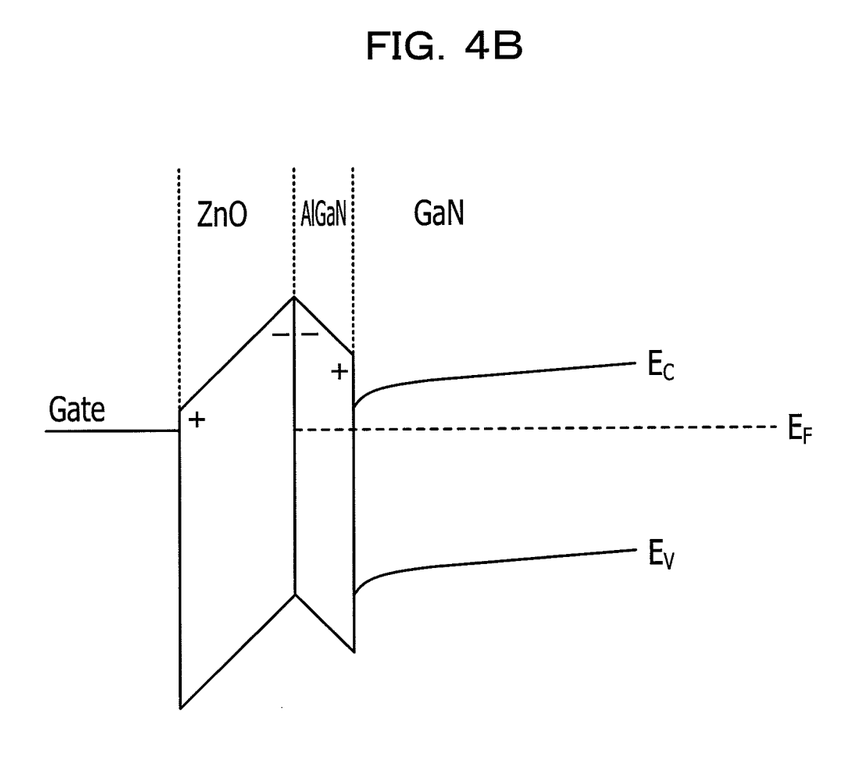
FIG. 4B is a view of a band diagram of the AlGaN/GaN HEMT according to the first embodiment.

In this case, as illustrated in FIG. 4B, the energy band of the gate electrode 15 is pushed up by the spontaneous polarization of the reverse polarity layer 7. At the interface of the electron transit layer 2 with the electron supply layer 4, the Fermi energy $E_F$ is smaller than the conduction band $E_C$, and substantially no two-dimensional electron gas is generated in the channel region. In this embodiment, since the reverse polarity layer 7 is used as a part of the gate insulating film 9, the threshold of the gate voltage is shifted in a positive direction (the threshold value turns into a predetermined positive value). Accordingly, as illustrated in FIG. 2, in the state in which no voltage is applied to the gate electrode 15, in the lower portion (channel region) of the gate electrode 15, the two-dimensional electron gas disappears, and a normally-off type transistor is realized.

Next, the spontaneous polarization of ZnO will be described in comparison with that of a nitride semiconductor.

The intensities of the spontaneous polarization of ZnO and nitride semiconductors (InN, GaN, and AlN) are shown in the following table.

| | Spontaneous Polarization ($C/m^2$) | a axis (nm) | Piezo Polarization on GaN ($C/m^2$) |
|---|---|---|---|
| InN | −0.032 | 3.533 | 0.237 |
| GaN | −0.029 | 3.189 | 0 |
| AlN | −0.081 | 3.112 | −0.048 |
| ZnO | −0.057 | 3.2496 | 0.035 |

As shown in the table, the intensity of the spontaneous polarization of ZnO is high next to that of AlN. If ZnO is grown over GaN or AlGaN, the piezo polarization will be generated in a direction to counteract the spontaneous polarization; however, the spontaneous polarization is larger than the piezo polarization. Therefore, when all types of polarizations are taken into consideration, since the spontaneous polarization exceeds the piezo polarization, in the reverse polarity layer 7, spontaneous polarization remains in the direction from a lower portion to an upper portion in the case in which the position of the cap layer 5 is regarded as a lowermost portion. Accordingly, the threshold of the gate voltage shows a predetermined positive value.

As described above, according to the AlGaN/GaN HEMT of this embodiment, a normally-off operation can be realized without causing inconveniences, such as an increase in sheet resistance, an increase in gate leak current, and a decrease in output power.

Hereinafter, modifications of this embodiment will be described. In the modifications, although materials for the compound semiconductor and the gate insulating film are different from those of this embodiment, for convenience of illustration, the same reference numerals as those in FIG. 1K of this embodiment will be used for description.

In a first modification, as the compound semiconductor device, an InAlN/GaN HEMT will be described.

InAlN and GaN are compound semiconductors which are able to have lattice constants similar to each other by adjusting their compositions. In this case, in FIG. 1K, the electron transit layer 2 is formed of i-GaN, the interlayer 3 is formed of i-InAlN, the electron supply layer 4 is formed of n-InAlN, and the cap layer 5 is formed of $n^+$-GaN. Since piezo polarization hardly occurs in this case, the two-dimensional electron gas is primarily generated by spontaneous polarization of InAlN.

By irradiation of the surface of the cap layer 5 with oxygen plasma, the polarity reverse layer 6 is formed, for example, as a denatured layer containing $Ga_2O_3$. As in the case of the first embodiment, the reverse polarity layer 7 is formed as O-polarity ZnO (or O-polarity MgO or a mixed crystal containing O-polarity ZnO and O-polarity MgO).

According to the InAlN/GaN HEMT of the first modification, as in the case of the AlGaN/GaN HEMT of the first embodiment, a normally-off operation can be realized by a relatively simple structure without causing inconveniences, such as an increase in sheet resistance, an increase in gate leak current, and a decrease in output power.

In a second modification, as the compound semiconductor device, an InAlGaN/GaN HEMT will be described.

Among the above two types of compound semiconductors, InAlGaN has a smaller lattice constant than that of GaN. In this case, in FIG. 1K, the electron transit layer 2 is formed of i-GaN, the interlayer 3 is formed of i-InAlGaN, the electron supply layer 4 is formed of n-GaN, and the cap layer 5 is formed of n$^+$-InAlGaN.

By irradiation of the surface of the cap layer 5 with oxygen plasma, the polarity reverse layer 6 is formed, for example, as a denatured layer containing $Ga_2O$. As in the case of the first embodiment, the reverse polarity layer 7 is formed as an O-polarity ZnO (or an O-polarity MgO or a mixed crystal containing an O-polarity ZnO and an O-polarity MgO).

According to the InAlGaN/GaN HEMT of the second modification, as in the case of the AlGaN/GaN HEMT of the first embodiment, a normally-off operation can be realized by a relatively simple structure without causing inconveniences, such as an increase in sheet resistance, an increase in gate leak current, and a decrease in output power.

In a third modification, as the compound semiconductor device, an InAlGaN/InAlN HEMT will be described.

When the composition ratios of In, Al, and Ga are adjusted in InAlN and InAlGaN, the magnitude correlation in the lattice constant therebetween is changed. By the adjustment of the composition ratios, for example, the lattice constant of InAlN can be set smaller than that of InAlGaN, or on the other hand, the lattice constant of InAlGaN can be set smaller than that of InAlN. In this modification, the case in which the lattice constant of InAlGaN is set smaller than that of InAlN will be described by way of example.

In this case, in FIG. 1K, the electron transit layer 2 is formed of i-InAlN, the interlayer 3 is formed of i-InAlGaN, the electron supply layer 4 is formed of n-InAlGaN, and the cap layer 5 is formed of n$^+$-InAlN.

For example, by irradiation of the surface of the cap layer 5 with oxygen plasma, the polarity reverse layer 6 is formed, for example, as a denatured layer of a mixed crystal containing $Al_2O_3$ and $In_2O_3$. As in the case of the first embodiment, the reverse polarity layer 7 is formed as an O-polarity ZnO (or O-polarity MgO or a mixed crystal containing an O-polarity ZnO and an O-polarity MgO).

According to the InAlGaN/InAlN HEMT of the third modification, as in the case of the AlGaN/GaN HEMT of the first embodiment, a normally-off operation can be realized by a relatively simple structure without causing inconveniences, such as an increase in sheet resistance, an increase in gate leak current, and a decrease in output power.

In a fourth modification, as the compound semiconductor device, an $Al_{0.5}Ga_{0.5}N/Al_{0.3}Ga_{0.7}N$ HEMT will be described.

Among the compound semiconductors containing the same elements, when the composition ratio is different therebetween, the lattice constant is also different from each other. As one type of compound semiconductor, such as AlGaN, having various lattice constants, for example, $Al_{0.3}Ga_{0.7}N$ and $Al_{0.5}Ga_{0.5}N$, may be mentioned. In AlGaN, its lattice constant is decreased as the composition ratio of Al is increased. Hence, $Al_{0.5}Ga_{0.5}N$ has a lattice constant smaller than that of $Al_{0.3}Ga_{0.7}N$.

In this case, in FIG. 1K, the electron transit layer 2 is formed of i-$Al_{0.3}Ga_{0.7}N$, the interlayer 3 is formed of i-$Al_{0.5}Ga_{0.5}N$, the electron supply layer 4 is formed of n-$Al_{0.5}Ga_{0.5}N$, and the cap layer 5 is formed of n$^+$-$Al_{0.3}Ga_{0.7}N$.

For example, by irradiation of the surface of the cap layer 5 with oxygen plasma, the polarity reverse layer 6 is formed, for example, as a denatured layer of a mixed crystal containing $Ga_2O_3$ and $Al_2O_3$. As in the case of the first embodiment, the reverse polarity layer 7 is formed as an O-polarity ZnO (or an O-polarity MgO or a mixed crystal containing an O-polarity ZnO and an O-polarity MgO).

According to the $Al_{0.5}Ga_{0.5}N/Al_{0.3}Ga_{0.7}N$ HEMT of the fourth modification, as in the case of the AlGaN/GaN HEMT of the first embodiment, a normally-off operation can be realized by a relatively simple structure without causing inconveniences, such as an increase in sheet resistance, an increase in gate leak current, and a decrease in output power.

In a fifth modification, as the compound semiconductor device, a ZnMgO/ZnO HEMT will be described.

In this case, in FIG. 1K, the electron transit layer 2 is formed of i-ZnO, the interlayer 3 is formed of i-ZnMgO, the electron supply layer 4 is formed of n-ZnMgO, and the cap layer 5 is formed of n$^+$-ZnO.

By a sputtering method or the like, one of $Ga_2O_3$, $Al_2O_3$, $In_2O_3$, $Cr_2O_3$, and a mixed crystal containing at least two thereof is deposited on the cap layer 5 to form the polarity reverse layer 6, for example, $Al_2O_3$ is deposited. As in the case of the first embodiment, the reverse polarity layer 7 is formed as an O-polarity ZnO (or an O-polarity MgO or a mixed crystal containing an O-polarity ZnO and an O-polarity MgO).

According to the ZnMgO/ZnO HEMT of the fifth modification, as in the case of the AlGaN/GaN HEMT of the first embodiment, a normally-off operation can be realized by a relatively simple structure without causing inconveniences, such as an increase in sheet resistance, an increase in gate leak current, and a decrease in output power.

In a second embodiment, as in the case of the first embodiment, although an AlGaN/GaN HEMT will be described, a method of forming a gate insulating film is different from that of the first embodiment.

Figure 5A:
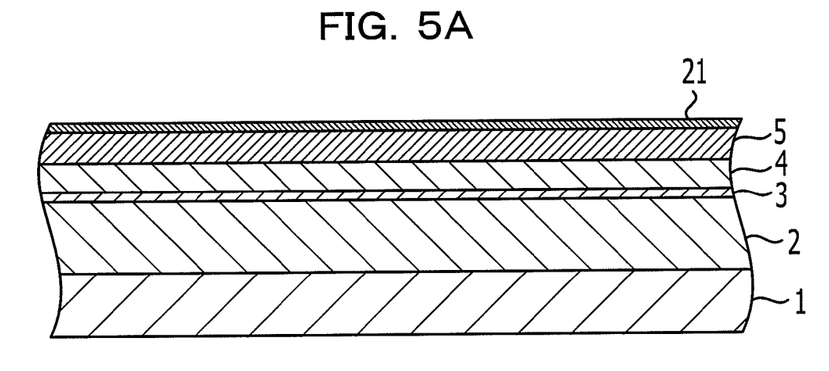
FIGS. 5A to 5C are views illustrating a method of manufacturing a compound semiconductor device according to a second embodiment.
Figure 5B:
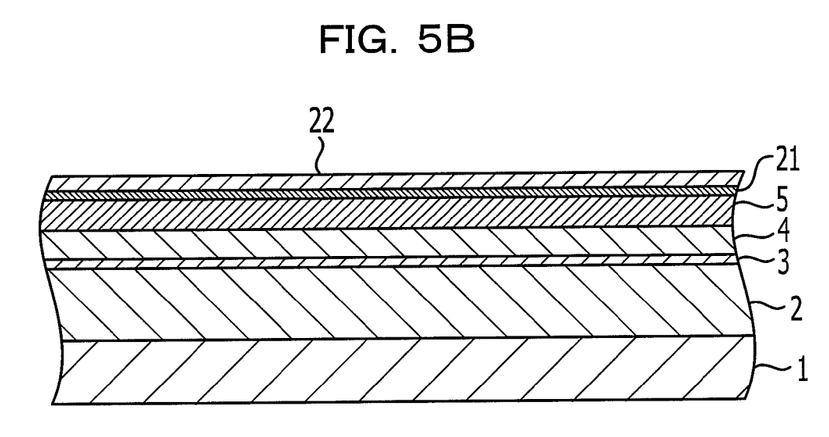
Figure 5C:
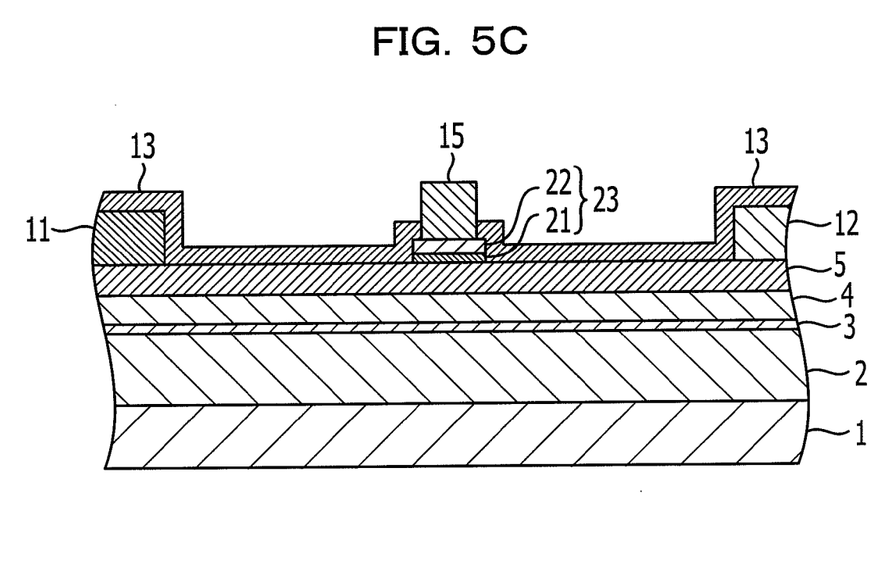

FIGS. 5A to 5C are views illustrating a method of manufacturing a compound semiconductor device according to the second embodiment.

In a step similar to that illustrated in FIG. 1A of the first embodiment, by an MBE method or the like, an electron transit layer 2, an interlayer 3, an electron supply layer 4, and a cap layer 5 are formed.

As illustrated in FIG. 5A, a polarity reverse layer 21 is formed.

A p-type impurity, such as a bis(cyclopentadienyl)magnesium gas ($Cp_2Mg$ gas), containing Mg is added at a predetermined flow rate to a raw material gas, so that Mg is doped to GaN. A doping concentration of Mg is set to, for example, approximately $1\times10^{19}$ to $1\times10^{22}/cm^3$ and is preferably set to, for example, approximately $5\times10^{20}/cm^3$. Accordingly, a polarity reverse layer 21 of p$^+$-GaN is formed over the cap layer 5 to have a thickness of, for example, approximately 3 nm. It has been known that the polarity of p$^+$-GaN doped with a p-type impurity, such as Mg, at the above concentration range is reversed.

As illustrated in FIG. 5B, a reverse polarity layer 22 is formed over the polarity reverse layer 21.

By an MBE method or the like, GaN is grown over the polarity reverse layer 21 to have a thickness of, for example, approximately 10 nm. At this stage, GaN has an N polarity by the presence of the polarity reverse layer 21; and hence, the reverse polarity layer 22 is formed. In the reverse polarity layer 22, the surface thereof opposite to a SiC substrate 1 is terminated by N, and in the direction from an upper portion to a lower portion in the case in which the position of the SiC substrate 1 is regarded as a lowermost portion; that is, for example, in the direction opposite to spontaneous polarization of the cap layer 5, the electric field of spontaneous polarization is generated.

Steps similar to those illustrated in FIGS. 1D to 1K of the first embodiment are then carried out. As a result, as illustrated in FIG. 5C, by filling Ni/Au in an opening 13a, a gate electrode 15 is formed over the cap layer 5 with a gate insulating film 23 interposed therebetween so as to protrude upward from the surface of a passivation film 13.

The AlGaN/GaN HEMT is formed through various steps, such as formation of an interlayer insulation film covering the gate electrode 15 and formation of wires connected to a source electrode 11, a drain electrode 12, and the gate electrode 15.

As described above, according to the AlGaN/GaN HEMT of the second embodiment, a normally-off operation can be realized by a relatively simple structure without causing inconveniences, such as an increase in sheet resistance, an increase in gate leak current, and a decrease in output power.

In a third embodiment, an electrical power apparatus including the HEMT according to one of the first embodiment, the modifications thereof, and the second embodiment will be described.

Figure 6:
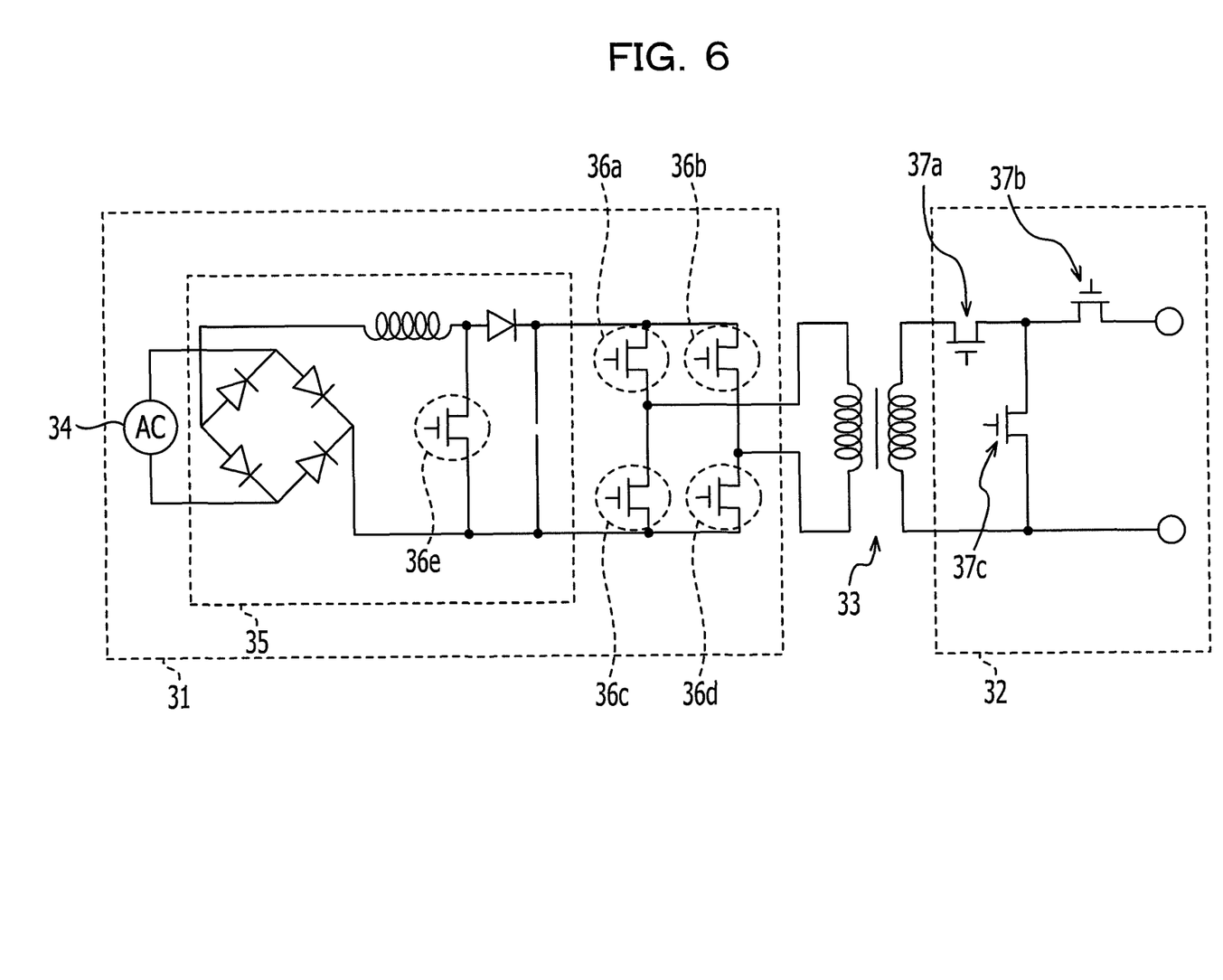
FIG. 6 is a view illustrating a circuit diagram of an electrical power apparatus according to a third embodiment.

FIG. 6 is a view illustrating a circuit diagram of an electrical power apparatus according to the third embodiment.

The electrical power apparatus according to the third embodiment includes a high-voltage primary side circuit 31, a low-voltage secondary side circuit 32, and a transformer 33 disposed therebetween.

The primary side circuit 31 includes an alternating-current power supply 34, a so-called bridge rectifier circuit 35, and switching elements 36a, 36b, 36c, and 36d (four elements are provided in this embodiment). In addition, the bridge rectifier circuit 35 has a switching element 36e.

The secondary side circuit 32 includes switching elements 37a, 37b, and 37c (three elements are provided in this embodiment).

In the third embodiment, the switching elements 36a, 36b, 36c, 36d, and 36e of the primary side circuit 31 form the HEMT according to one of the first embodiment, the modifications thereof, and the second embodiment. On the other hand, the switching elements 37a, 37b, and 37c of the secondary side circuit 32 form a general metal-insulator-semiconductor field-effect transistor (MIS-FET) using silicon.

In the third embodiment, a HEMT which is capable of realizing a normally-off operation by a relatively simple structure without causing inconveniences, such as an increase in sheet resistance, an increase in gate leak current, and a decrease in output power is applied to a high-voltage circuit. Accordingly, a highly reliable and high power electrical power circuit is realized.

In a fourth embodiment, a high frequency amplifier including the HEMT according to one of the first embodiment, the modifications thereof, and the second embodiment will be described.

Figure 7:
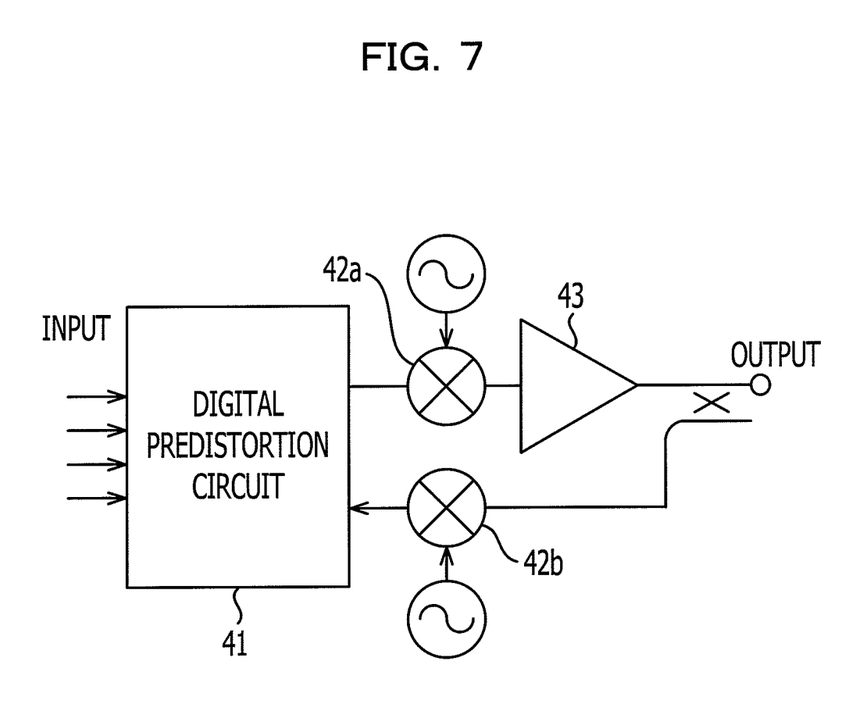
FIG. 7 is a view illustrating a circuit diagram of a high frequency amplifier according to a fourth embodiment.

FIG. 7 is a view illustrating a circuit diagram of a high frequency amplifier according to the fourth embodiment.

The high frequency amplifier according to the fourth embodiment is applied to, for example, a power amplifier for a base station of cellular phone. This high frequency amplifier includes a digital predistortion circuit 41, mixers 42a and 42b, and a power amplifier 43.

The digital predistortion circuit 41 compensates for non-linear distortion of an input signal. The mixer 42a mixes an alternating current signal and an input signal in which non-linear distortion is compensated. The power amplifier 43 is an amplifier which amplifies an input signal mixed with an alternating current signal and which has the HEMT according to one of the first embodiment, the modifications thereof, and the second embodiment. In addition, as illustrated in FIG. 7, the circuit is formed so that, for example, by changing a switch, a signal at an output side is mixed with an alternating current signal by the mixer 42b and is sent to the digital predistortion circuit 41.

In the fourth embodiment, a HEMT which is capable of realizing a normally-off operation by a relatively simple structure without causing inconveniences, such as an increase in sheet resistance, an increase in gate leak current, and a decrease in output power, is applied to a high frequency amplifier. Accordingly, a highly reliable high frequency amplifier having a high withstand voltage is realized.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments in accordance with aspects of the present invention have been described in detail, it should be understood that various changes, substitutions, and alterations could be made hereto without departing from the spirit and scope of the invention.

What is claimed is:

1. A compound semiconductor device, comprising:
   a substrate;
   a compound semiconductor layer formed over the substrate; and
   a gate electrode formed over the compound semiconductor layer with a gate insulating film arranged therebetween,
   the gate insulating film including a first layer having reverse spontaneous polarization, the direction of which is opposite to spontaneous polarization of the compound semiconductor layer.

2. The compound semiconductor device according to claim 1,
   wherein the gate insulating film further includes a second layer which reverses the direction of spontaneous polarization, and
   wherein the first layer is formed over the second layer.

3. The compound semiconductor device according to claim 1,
   wherein the first layer includes one of an O-polarity ZnO, an O-polarity MgO, and a mixed crystal therebetween.

4. The compound semiconductor device according to claim 2,
   wherein the second layer includes one of $Ga_2O_3$, $Al_2O_3$, $In_2O_3$, $Cr_2O_3$, and a mixed crystal containing at least two thereof.

5. The compound semiconductor device according to claim 2,
   wherein the first layer includes an N-polarity GaN.

6. The compound semiconductor device according to claim 5,
   wherein the second layer includes GaN doped with a p-type impurity.

7. The compound semiconductor device according to claim 1,
   wherein the compound semiconductor layer includes one selected from the group consisting of InAlN/GaN, InAl- GaN/GaN, InAlN/InAlGaN, two types of AlGaN having different compositions, and ZnO/ZnMgO.

8. A method of manufacturing a compound semiconductor device, comprising:
forming a compound semiconductor layer over a substrate;
forming a gate insulating film over the compound semiconductor layer; and
forming a gate electrode over the gate insulating film,
the gate insulating film including a first layer having reverse spontaneous polarization, the direction of which is opposite to spontaneous polarization of the compound semiconductor layer.

9. The method of manufacturing a compound semiconductor device according to claim 8,
wherein the gate insulating film further includes a second layer which reverses the direction of spontaneous polarization, and
the first layer is formed over the second layer.

10. The method of manufacturing a compound semiconductor device according to claim 8,
wherein the first layer includes one of an O-polarity ZnO, an O-polarity MgO, and a mixed crystal therebetween.

11. The method of manufacturing a compound semiconductor device according to claim 9,
wherein the second layer includes one of $Ga_2O_3$, $Al_2O_3$, $In_2O_3$, $Cr_2O_3$, and a mixed crystal containing at least two thereof.

12. The method of manufacturing a compound semiconductor device according to claim 9,
wherein the first layer includes an N-polarity GaN.

13. The method of manufacturing a compound semiconductor device according to claim 12,
wherein the second layer is formed by adding a p-type impurity to GaN.

14. The method of manufacturing a compound semiconductor device according to claim 8,
wherein the compound semiconductor layer includes one selected from the group consisting of InAlN/GaN, InAl-GaN/GaN, InAlN/InAlGaN, two types of AlGaN having different compositions, and ZnO/ZnMgO.

15. An electrical power circuit, comprising:
a high-voltage circuit;
a low-voltage circuit; and
a transformer provided therebetween,
the high-voltage circuit includes a transistor which includes:
wherein a substrate,
a compound semiconductor layer formed over the substrate, and
a gate electrode formed over the compound semiconductor layer with a gate insulating film arranged therebetween, and
the gate insulating film including a first layer having reverse spontaneous polarization, the direction of which is opposite to spontaneous polarization of the compound semiconductor layer.

16. The electrical power circuit according to claim 15,
wherein the gate insulating film further includes a second layer which reverses the direction of spontaneous polarization, and
wherein the first layer is formed over the second layer.

17. A high frequency amplifier, comprising:
a substrate;
a compound semiconductor layer formed over the substrate; and
a gate electrode formed over the compound semiconductor layer with a gate insulating film arranged therebetween,
the gate insulating film including a first layer having reverse spontaneous polarization, the direction of which is opposite to spontaneous polarization of the compound semiconductor layer.

18. The high frequency amplifier according to claim 17,
wherein the gate insulating film further includes a second layer which reverses the direction of spontaneous polarization, and
wherein the first layer is formed over the second layer.

* * * * *